United States Patent
Coles et al.

(10) Patent No.: US 6,303,275 B1
(45) Date of Patent: Oct. 16, 2001

(54) METHOD FOR RESIST FILLING AND PLANARIZATION OF HIGH ASPECT RATIO FEATURES

(75) Inventors: Robert A. Coles, Manassas, VA (US); John W. Golz, Nelsonville, NY (US); Qinghuang Lin, Mt. Kisco, NY (US); Alan C. Thomas, Hughsonville, NY (US); Christopher J. Waskiewicz; Teresa J. Wu, both of Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/501,653

(22) Filed: Feb. 10, 2000

(51) Int. Cl.$^7$ ...................................................... G03C 5/00
(52) U.S. Cl. .............................. 430/320; 430/311; 438/49
(58) Field of Search ................................. 430/311, 320, 430/296; 438/49

(56) References Cited

U.S. PATENT DOCUMENTS

| | | | |
|---|---|---|---|
| 4,994,409 | * 2/1991 | Yoon et al. | 437/164 |
| 5,240,812 | 8/1993 | Conley et al. | 430/273 |
| 5,324,550 | 6/1994 | Yamaguchi et al. | 427/510 |
| 5,486,267 | 1/1996 | Knight et al. | 156/659.11 |
| 5,492,858 | 2/1996 | Bose et al. | 437/67 |
| 5,618,751 | * 4/1997 | Golden et al. | 438/392 |
| 5,750,312 | 5/1998 | Chandross et al. | 430/273.1 |
| 5,811,347 | 9/1998 | Gardner et al. | 438/435 |
| 6,054,254 | * 4/2000 | Sato et al. | 430/322 |
| 6,093,647 | * 7/2000 | Yu et al. | 438/687 |
| 6,235,452 | * 5/2001 | Collins et al. | 430/322 |

* cited by examiner

Primary Examiner—Janet Baxter
Assistant Examiner—Barbara Gilmore
(74) Attorney, Agent, or Firm—Ratner & Prestia; Jay H. Anderson, Esq.

(57) ABSTRACT

A method of forming a resist layer of uniform thickness across a surface patterned with a varying density of high aspect ratio features. A selected material layer having an affinity to a resist coat to be applied over the selected material layer is applied to a wafer having a plurality of recesses before applying a resist coat. After the resist coat is applied over the selected material layer, the selected material diffuses partially into the resist coat to condition a portion of the resist coat to be insoluble in the presence of a developer which is applied after the resist coat. Those portions of the resist coat into which the selected material layer has not diffused then are removed by a developer leaving a uniform resist coat thickness across the wafer.

20 Claims, 3 Drawing Sheets

METHOD FOR RESIST FILLING AND PLANARIZATION OF HIGH ASPECT RATIO FEATURES

TECHNICAL FIELD

The present invention relates, in general, to the fabrication of semiconductor devices and, in particular, to the formation of a resist layer of uniform thickness across a surface patterned with a varying density of high aspect ratio features, such as an array of "deep trenches" formed in the manufacture of DRAM devices.

BACKGROUND OF THE INVENTION

Dynamic Random Access Memory (DRAM) cells can retain information only temporarily, on the order of milliseconds, even with power continuously applied. Therefore, the cells must be read and refreshed at periodic intervals. Although the storage time may appear to be short, it is actually long enough to allow many memory operations to occur between refresh cycles. The advantages of cost per bit, device density, and flexibility of use (i.e., both read and write operations are possible) have made DRAM cells the most widely used form of semiconductor memory to date. The earliest DRAM cells were three-transistor cells. Today, DRAM cells consisting of only one transistor and one capacitor have been implemented.

When forming semiconductor devices such as a DRAM cell having high aspect ratio features (i.e., the depths of recesses in the device surface are many times greater than the widths of the recesses), it is difficult to form a uniform resist layer across the device surface. Conventional "spin coating" methods are unsuccessful because, after application, the coated material undergoes a volume change during solvent evaporation and material densification. The shrinkage, due to volume change, draws material down into the features causing the coated material to be pulled down, thereby thinning the coated material in areas of high pattern density.

These non-uniformities are problematic when the resist is subsequently etched to form a recessed barrier or stopping layer of controlled and uniform depth. Such a barrier or stopping layer might be formed, for example, in the fabrication of a DRAM device to define vertical features into each trench in an array, such as to form a buried dopant out-diffusion of controlled depth, or to define the length of junctions and gate electrodes in a vertical transistor.

During such processing, variations in the thickness of the starting, top layer result in undesirable cross-wafer variations in recess depth. The amount of process variation within a chip and across a wafer for the resist recess process depends mainly upon: (1) the etch rate profile within a chip and across a wafer, and (2) the resist profile within a chip and across a wafer.

Referring to FIGS. 1 and 2, during solvent evaporation and material densification, the shrinkage of a resist 10, due to volume change, draws material down into a plurality of trenches 12 in a wafer 14. The result is non-uniform depths with the degree of variation in depth indicated by arrows 16 in FIG. 2. Without precise and uniform control over vertical depths, device dimensions cannot be controlled accurately across the wafer, or even within the chip.

A variety of suggestions have been offered for solving this problem. Viscosity, spin speeds, baking and curing conditions and thickness all have been varied in attempts to improve the uniformity of the coating from the center to the edge of the wafer. However, significant center-to-edge thickness variation and pattern factor variation are still present.

Attempts to planarize the resist after baking are known. For example, chemical-mechanical planarization processes such as Chemical-Mechanical Polishing (CMP) have been applied. The results of these attempts have not been fully qualified. Moreover, the addition of a chemical mechanical planarization step adds greatly to production costs.

Resist planarization, using exposure methods, also has been proposed. An exposure step requires additional equipment, however, such as a photolithography tool or a flood exposure system. "Photolithography" is a process in which a light source illuminates a pattern and projects the image through a lens assembly onto a semiconductor wafer or substrate. Ultimately, the pattern is etched into the wafer. Such additional equipment results in additional production costs.

There remains a need, therefore, for an improved method of forming a resist layer of uniform thickness across a surface patterned with a varying density of high aspect ratio features. It is an object of the present invention to provide a new and improved method of resist filling and planarization for the fabrication of semiconductor devices. It is another object of the present invention to provide a method of resist filling and planarization for the fabrication of semiconductor devices that eliminates, or at least greatly reduces, center-to-edge thickness variations in the resist coating that is applied during the fabrication of the semiconductor devices. It is a further object of the present invention to provide a method of resist filling and planarization for the fabrication of semiconductor devices that does not add greatly to the cost of fabrication of the semiconductor devices. It is still another object of the present invention to provide a method of resist filling and planarization for the fabrication of semiconductor devices that does not require the use of additional, expensive equipment in the fabrication of the semiconductor devices.

SUMMARY OF THE INVENTION

To meet these and other objects, and in view of its purposes, the present invention provides a method of resist filling and planarization for the fabrication of semiconductor devices. In accordance with the present invention, the method includes the steps of providing a wafer having a plurality of recesses in a surface of the wafer and applying to the surface of the wafer and the surfaces of the recesses a layer of a selected material having an affinity to a resist coat to be applied subsequently over the selected material layer. A method of resist filling and planarization for the fabrication of semiconductor devices, in accordance with the present invention, also includes the steps of applying a resist coat over the selected material layer and allowing the selected material layer to diffuse partially into the resist coat to condition a portion of the resist coat closest to the wafer to be insoluble in the presence of a developer applied subsequently to the resist coat. A method of resist filling and planarization for the fabrication of semiconductor devices, in accordance with the present invention, further includes the step of applying a developer to the resist coat to remove portions of the resist coat spaced from the wafer by the portion of the resist coat into which the selected material layer has diffused and which has been conditioned to be insoluble in the presence of the developer and into which the selected material layer has not diffused and which has not been conditioned to be insoluble in the presence of the developer.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Before describing the method of the present invention in detail, it will be useful to define two basic terms. First, "pH" is a measure of the acidity of a material. The material is considered acidic if the pH is below 7 and is considered basic if the pH is above 7. A material having a pH of 7 is considered neutral. If an acidic chemical species is added to a material, the pH of the material is lowered. In contrast, if a basic chemical species is added to a material, the pH of the material is increased.

Second, "diffusion" is a process during which chemical species move from a region of high concentration to a region of low concentration. If a material A contains a higher concentration of chemical species X than does a material B and material A and material B are placed in contact with one another and species X is a species that diffuses, species X can be made to move or diffuse from material A into material B. The amount of species X which diffuses into material B increases with the temperature of materials A and B. Consequently, it is often by application of heat treatment that diffusion can be made to occur in a controlled manner.

Figure 1:
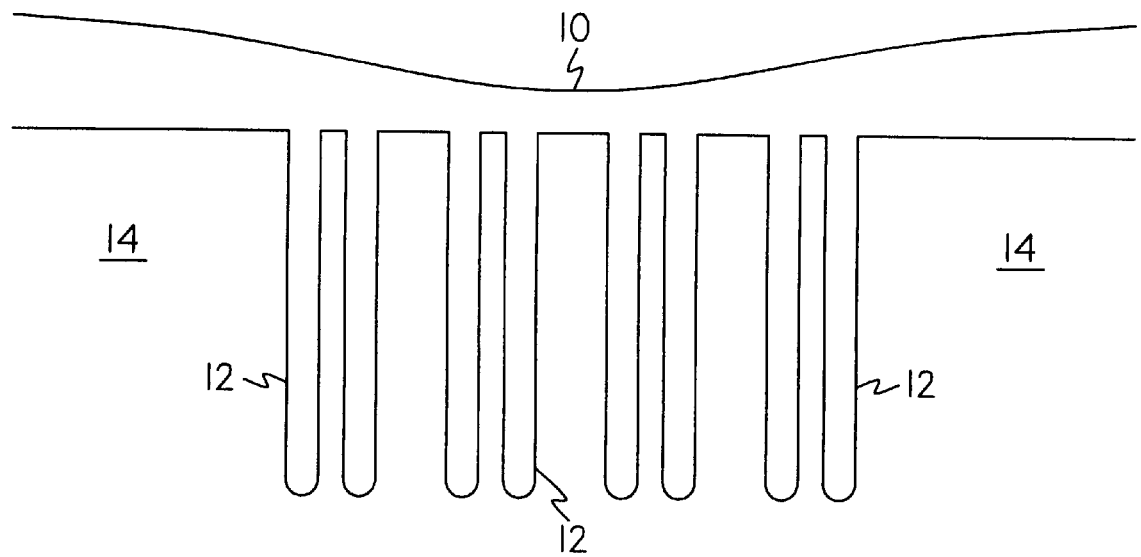
FIG. 1 shows the variations in thickness of a resist layer caused by a volume change during solvent evaporation and material densification according to prior art techniques for the fabrication of semiconductor devices.
Figure 2:
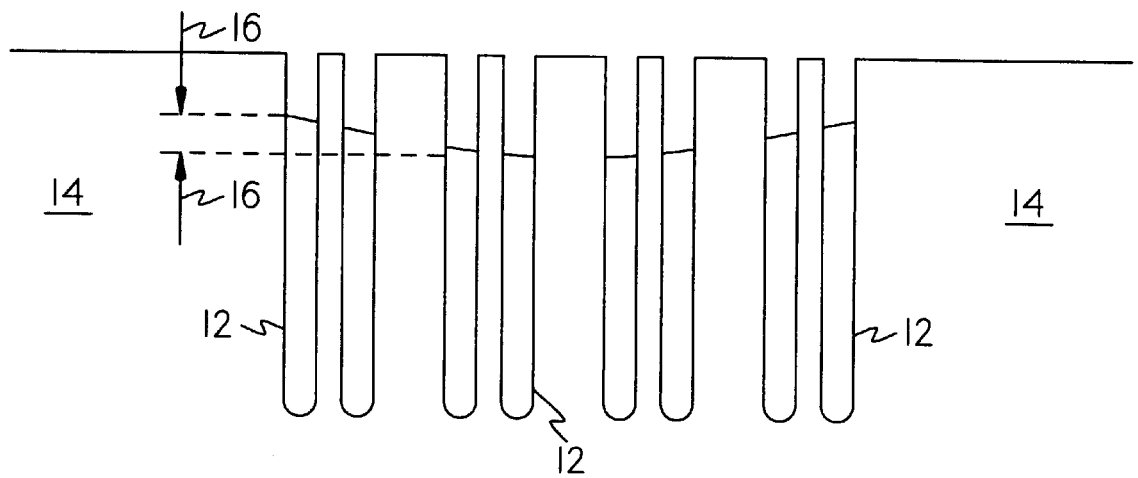
FIG. 2 shows the non-uniform depths of trenches resulting from the variations in thickness of a resist layer caused by a volume change during solvent evaporation and material densification according to prior art techniques for the fabrication of semiconductor devices.
Figure 3:
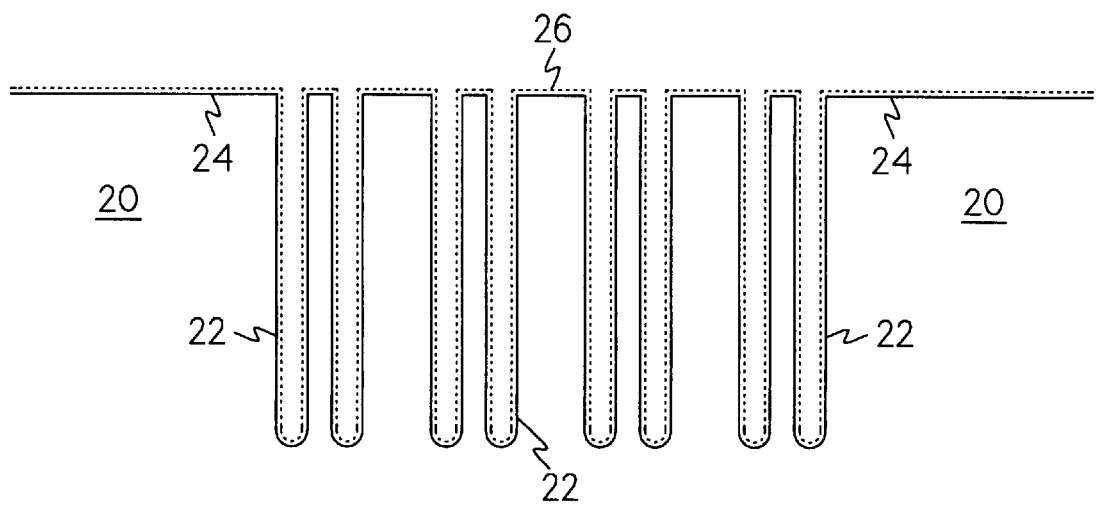
FIG. 3 shows the first step of a method of resist filling and planarization for the fabrication of semiconductor devices according to the present invention.

Referring to FIG. 3, a method of resist filling and planarization for the fabrication of semiconductor devices according to the present invention includes the step of providing a wafer 20 having a plurality of recesses 22 in a surface 24 of wafer 20. Wafer 20 can be the substrate in which deep trenches, namely recesses 22, are formed. For example, deep trenches are formed in the fabrication of a DRAM device to define the length of junctions and gate electrodes in a vertical transistor. Wafer 20 can be characterized as having high aspect ratio features because the depths of recesses 22 are many times greater than the widths of recesses 22.

Figure 4:
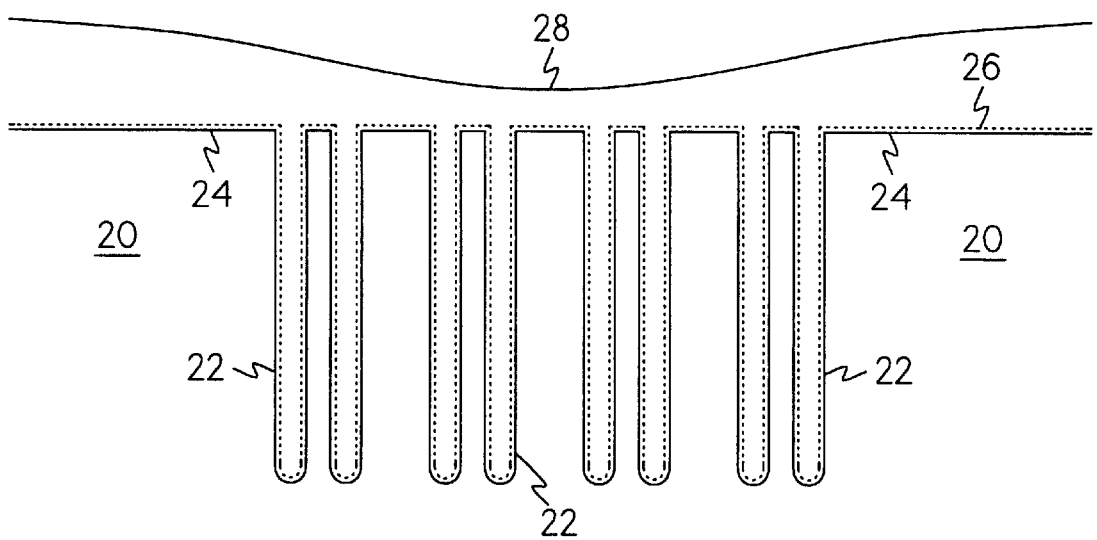
FIG. 4 shows the second step of a method of resist filling and planarization for the fabrication of semiconductor devices according to the present invention.

Next, a layer 26 of selected catalyzing material, shown by dotted lines, is applied to surface 24 of wafer 20 and the surfaces of recesses 22. Selected material layer 26 has an affinity to a resist coat 28 to be applied subsequently over selected material layer 26 as shown in FIG. 4. More specifically, selected material layer 26 contains one or more components that can diffuse into resist coat 28.

Selected material layer 26 can be applied to surface 24 of wafer 20 and the surfaces of recesses 22 in either one step or two or more steps. Selected material layer 26 can be applied to surface 24 of wafer 20 and the surfaces of recesses 22 already containing the one or more components that can diffuse into resist coat 28 or the one or more components that can diffuse into resist coat 28 can be applied to a base layer after the base layer has been applied to surface 24 of wafer 20 and the surfaces of recesses 22.

In a first embodiment of the present invention, selected material layer 26 contains a basic chemical species (i.e., pH greater than 7) which can be, for example, ammonia or an amine-containing film such as silicon nitride or silicon oxynitride. As such, selected material layer 26 contains a chemical species that can diffuse into resist coat 28 to be applied subsequently over selected material layer 26 causing a decrease in the acidity of that region of resist coat 28. Selected material layer 26 can be applied by depositing a thin film, applying a wet chemical, plasma treatment, or the like.

In accordance with the first embodiment of the present invention, resist coat 28 is composed of a polymer that contains an acid-sensitive protecting group functioning such that when the pH is above a certain threshold value, it prevents dissolution of the polymer by a developer, such as tetra-methyl-ammonium-hydroxide (IMAH), but, when the pH is below the certain threshold, it does not protect the polymer from dissolution (i.e., the polymer can dissolve). Contained in resist coat 28 is an acid species, or an acid-generating species that creates acid within the resist coat in response to some treatment such as exposure to light (i.e., a photo-acid generator) or to heat (i.e., a thermal-acid generator such as para-nitro-benzyltosylate).

In a second embodiment of the present invention, selected material layer 26 contains an acid chemical species (i.e., pH less than 7) which can be, for example, canphore sulfonic acid, perfluorobutane sulfonic acid, or perfluorooctane sulfonic acid. As such, selected material layer 26 contains a chemical species that can diffuse into resist coat 28 applied subsequently over selected material layer 26 causing an increase in the acidity of that region of resist coat 28. As with the first embodiment of the present invention, the selected material layer 26 of the second embodiment can be applied by depositing a thin film, applying a wet chemical, plasma treatment, or the like.

In accordance with the second embodiment of the present invention, resist coat 28 is composed of a polymer, for example tetramethoxymethylglycoluril, that will cross-link in an acidic environment but will not cross-link in a non-acidic environment. Cross-linking of the polymer causes it to become insoluble in a developer, such as TMAH.

Figure 5:
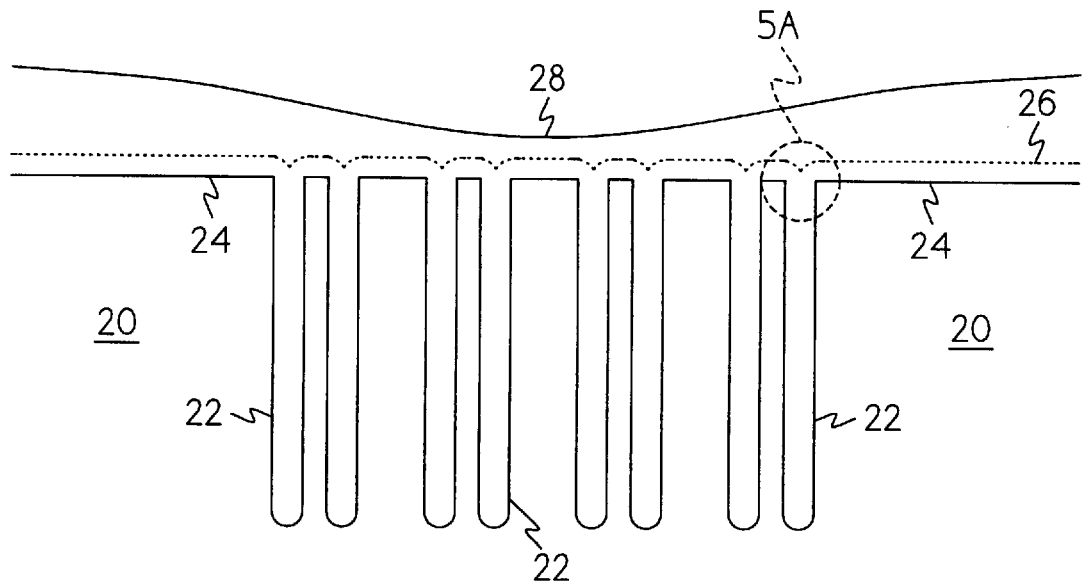
FIG. 5 shows the third step of a method of resist filling and planarization for the fabrication of semiconductor devices according to the present invention.

Referring to FIG. 4, a method of resist filling and planarization for the fabrication of semiconductor devices according to the present invention also includes the steps of applying a resist coat 28 over selected material layer 26 and allowing selected material layer 26 to diffuse partially into resist coat 28 a given distance creating a layer of reacted material as shown by FIG. 5. In both embodiments of the present invention, selected material layer 26 diffuses partially into resist coat 28 a given distance creating a layer of reacted material in that portion of resist coat 28 closest to wafer 20. In the first embodiment of the present invention, diffusion of the basic chemical species in selected material layer 26 into resist coat 28 causes an increase in the pH of that portion of resist coat 28 into which selected material layer 26 diffuses (i.e., this portion of resist coat 28 becomes less acidic or even basic) and this reduction in the acid concentration in this region is sufficient to allow the protecting group to render this region insoluble in developer. In the second embodiment of the present invention, diffusion of the acid chemical species in selected material layer 26 into resist coat 28 causes a decrease in the pH of that portion of resist coat 28 into which selected material layer 26 diffuses (i.e., this portion of resist coat 28 becomes more acidic) and this increase in the acid concentration in this region is sufficient to allow cross-linking of the polymers in resist coat 28 to render this region insoluble in developer.

Figure 5A:
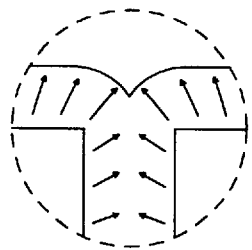
FIG. 5A is an enlargement of a portion of FIG. 5.

By taking advantage of chemically amplified reactions, such as those that occur in Deep Ultraviolet (DUV) photoresists, selected material layer 26 can be very thin and of low concentration. For example, DUV photoresists react with very low concentrations of the selected material layers identified above. In effect, selected material layer 26 "poisons" by diffusion the bottom of resist coat 28, lowering the development rate of the resist in the layer contacting surface 24 of wafer 20, thereby developing a resist "footing" shown symbolically on an enlarged scale in FIG. 5A. The arrows in FIG. 5A illustrate catalyst diffusion from selected material layer 26 into resist coat 28.

Figure 6:
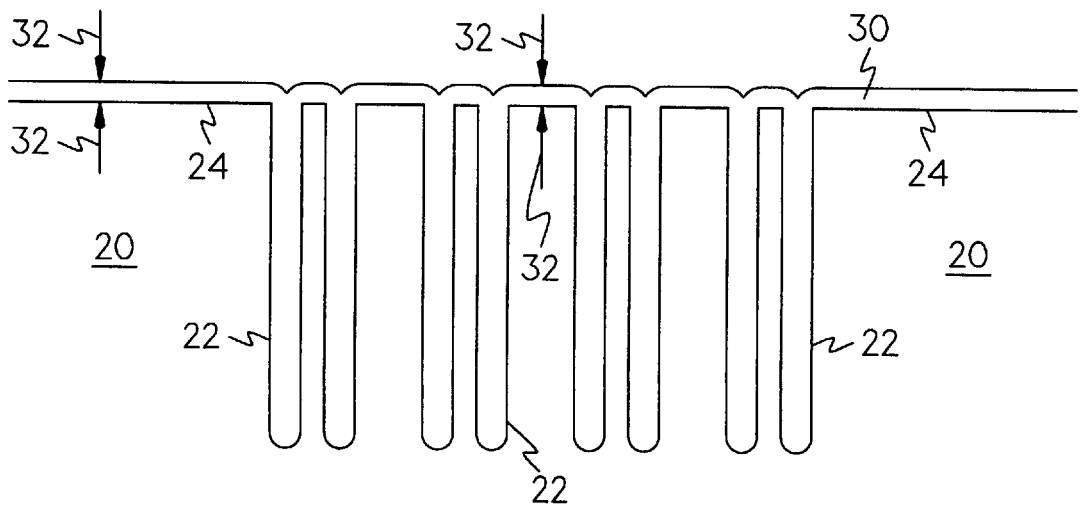
FIG. 6 shows the fourth step of a method of resist filling and planarization for the fabrication of semiconductor devices according to the present invention.

Referring to FIG. 6, a method of resist filling and planarization for the fabrication of semiconductor devices according to the present invention further includes the step of removing unreacted portions of resist coat 28. The portions of resist coat 28 that are removed are those portions of resist coat 28 spaced from wafer 20 and into which selected material layer 26 has not diffused. Such removal leaves a layer of reacted resist coat material 30 having a uniform resist height as represented by arrows 32 in FIG. 6. Conventional etching techniques, using a liquid developer such as TMAH, can be applied to remove non-catalyzed portions of resist coat 28 into which selected material layer 26 has not diffused.

Those portions of resist coat 28 into which selected material layer 26 has diffused, namely the layer of reacted resist coat material 30, are not etched away. The relatively uniform height 32 of the remaining reacted resist coat material 30 is determined by the diffusion length from surface 24 of wafer 20. Therefore, reacted resist coat material 30 is substantially planar with respect to surface 24, independent of the pattern and characteristics of recesses 22 and the liquid flow characteristics and material shrinkage occurring during and after the spin coating application of resist coat 28. The phrase "substantially planar" means planar with allowance for minor deviations from planarity.

Once the uniform reacted resist coat material 30 is formed, processing using normal chemical downstream etching, or other such techniques, can be used to recess the resist to the desired depth. Because all of the resist is later removed from the wafer, there should be little, if any, concern given to contamination of the device from catalyzing selected material layer 26.

Although illustrated and described above with reference to certain specific embodiments, the present invention is nevertheless not intended to be limited to the details shown. Rather, various modifications may be made in the details within the scope and ranger of equivalents of the claims and without departing from the spirit of the invention.

What is claimed:

1. A method of resist filling and planarization for the fabrication of semiconductor devices comprising the steps of:

providing a wafer having a plurality of recesses in a surface of the wafer;

applying to said surface of said wafer and the surfaces of said recesses a layer of a selected material having an affinity to a resist coat to be applied subsequently over said selected material layer;

applying a resist coat over said selected material layer;

allowing said selected material layer to diffuse partially into said resist coat to condition a portion of said resist coat closest to said wafer to be insoluble in the presence of a developer applied subsequently to said resist coat; and applying a developer to said resist coat to remove portions of said resist coat:
   (a) spaced from said wafer by said portion of said resist coat into which said selected material layer has diffused and which has been conditioned to be insoluble in the presence of said developer, and
   (b) into which said selected material layer has not diffused and which has not been conditioned to be insoluble in the presence of said developer.

2. The method of resist filling and planarization for the fabrication of semiconductor devices according to claim 1 wherein:

(a) said selected material layer contains a basic chemical species, and
   (b) said resist coat contains a polymer that:
     (1) is not dissolved by said developer when the pH in said resist coat is above a threshold value, and
     (2) is dissolved by said developer when the pH in said resist coat is below the threshold value.

3. The method of resist filling and planarization for the fabrication of semiconductor devices according to claim 2 wherein:

(a) said basic chemical species in said selected material layer is ammonia,
   (b) said polymer in said resist coat contains at least one of an acid species and an acid-generating species, and
   (c) said developer is tetra-methyl-ammonium-hydroxide.

4. The method of resist filling and planarization for the fabrication of semiconductor devices according to claim 2 wherein:

(a) said basic chemical species in said selected material layer is silicon nitride,
   (b) said polymer in said resist coat contains at least one of an acid species and an acid-generating species, and
   (c) said developer is tetra-methyl-ammonium-hydroxide.

5. The semiconductor device fabricated using the method according to claim 4.

6. The method of resist filling and planarization for the fabrication of semiconductor devices according to claim 2 wherein:

(a) said basic chemical species in said selected material layer is silicon oxynitride,
   (b) said polymer in said resist coat contains at least one of an acid species and an acid-generating species, and
   (c) said developer is tetra-methyl-ammonium-hydroxide.

7. The method of resist filling and planarization for the fabrication of semiconductor devices according to claim 2 wherein:
(a) said selected material layer contains an acid chemical species, and
(b). said resist coat contains a polymer that:
(1) does not cross-link when the pH in said resist coat is above a threshold value, and
(2) cross-links when the pH in said resist coat is below the threshold value.

8. The method of resist filling and planarization for the fabrication of semiconductor devices according to claim 6 wherein:
(a) said acid chemical species in said selected material layer is canphore sulfonic acid,
(b) said polymer in said resist coat is tetramethoxymethylglycoluril, and
(c) said developer is tetra-methyl-ammonium-hydroxide.

9. The method of resist filling and planarization for the fabrication of semiconductor devices according to claim 6 wherein:
(a) said acid chemical species in said selected material layer is perfluorobutane sulfonic acid,
(b) said polymer in said resist coat is tetramethoxymethylglycoluril, and
(c) said developer is tetra-methyl-ammonium-hydroxide.

10. The method of resist filling and planarization for the fabrication of semiconductor devices according to claim 6 wherein:
(a) said acid chemical species in said selected material layer is perfluorooctane sulfonic acid,
(b) said polymer in said resist coat is tetrarnethoxymethylglycoluril, and
(c) said developer is tetra-methyl-ammonium-hydroxide.

11. The method of resist filling and planarization for the fabrication of semiconductor devices according to claim 1 wherein said selected material layer is applied by depositing a thin film.

12. The method of resist filling and planarization for the fabrication of semiconductor devices according to claim 1 wherein said selected material layer is applied as a wet chemical.

13. The method of resist filling and planarization for the fabrication of semiconductor devices according to claim 1 wherein said selected material layer is applied by plasma treatment.

14. The semiconductor device fabricated using the method according to claim 1.

15. In a method of resist filling and planarization for the fabrication of semiconductor devices including the steps of providing a wafer having a plurality of recesses in a surface of the wafer, applying a resist coat, and removing portions of said resist coat by applying a developer to said resist coat, the improvement comprising the steps of:
before applying said resist coat, applying to said surface of said wafer and the surfaces of said recesses a layer of a selected material having an affinity to said resist coat; and
allowing said selected material layer to diffuse partially into said resist coat to condition a portion of said resist coat closest to said wafer to be insoluble in the presence of the developer applied to said resist coat.

16. The method of claim 15 wherein said selected material layer contains one of a basic chemical species and an acid chemical species.

17. The method of claim 16 wherein said basic chemical species is at least one of:
(a) ammonia,
(b) silicon nitride, and
(c) silicon oxynitride.

18. The method of claim 17 wherein said resist coat contains a polymer that has at least one of an acid species and an acid-generating species.

19. The method of claim 16 wherein said acid chemical species is at least one of:
(a) canphore sulfonic acid,
(b) perfluorobutane sulfonic acid, and
(c) perfluorooctane sulfonic acid.

20. The method of claim 19 wherein said resist coat contains a polymer that is tetramethoxymethylglycoluril.

* * * * *

UNITED STATES PATENT AND TRADEMARK OFFICE
CERTIFICATE OF CORRECTION

PATENT NO. : 6,303,275 B1
DATED : October 16, 2001
INVENTOR(S) : Robert A. Coles It is certified that error appears in the above-identified patent and that said Letters Patent is hereby corrected as shown below:

<u>Column 4,</u>
Line 37, delete "(IMAH)" and insert -- (TMAH) --; and

<u>Column 7,</u>
Line 33, delete "tetranethoxymethylglycoluril" and insert
-- tetramethoxymethylglycoluril --.

Signed and Sealed this

Twenty-third Day of July, 2002

*Attest:*

*Attesting Officer*

JAMES E. ROGAN
*Director of the United States Patent and Trademark Office*